United States Patent
Chae et al.

(10) Patent No.: US 7,772,101 B2
(45) Date of Patent: Aug. 10, 2010

(54) PHASE-CHANGE MEMORY DEVICE AND METHOD FOR MANUFACTURING THE SAME

(75) Inventors: Su-Jin Chae, Ichon (KR); Keum-Bum Lee, Ichon (KR); Min-Yong Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/146,184

(22) Filed: Jun. 25, 2008

(65) Prior Publication Data

US 2009/0039334 A1  Feb. 12, 2009

(30) Foreign Application Priority Data

Aug. 10, 2007  (KR) .................. 10-2007-0080510

(51) Int. Cl.
*H01L 21/44* (2006.01)
(52) U.S. Cl. .............. 438/578; 438/640; 438/666; 257/653; 257/654; 257/E21.205
(58) Field of Classification Search .............. None
See application file for complete search history.

(56) References Cited

U.S. PATENT DOCUMENTS 6,066,872 A * 5/2000 Okada et al. ............ 257/309
2005/0280103 A1 * 12/2005 Langdo et al. ............ 257/401
2006/0127680 A1 * 6/2006 Tzou et al. ................ 428/427
2007/0004127 A1 * 1/2007 Lee ........................... 438/243
2007/0114508 A1   5/2007 Herner et al.
2008/0003799 A1 * 1/2008 Kim et al. .................. 438/597
2009/0200536 A1 * 8/2009 Van Schaijk et al. ......... 257/4

FOREIGN PATENT DOCUMENTS

| KR | 1019990043548 | 6/1999 |
| KR | 1020010047537 | 6/2001 |
| KR | 100655082 | 12/2006 |

* cited by examiner

*Primary Examiner*—Evan Pert
*Assistant Examiner*—Scott R Wilson
(74) *Attorney, Agent, or Firm*—Baker & McKenzie LLP

(57) ABSTRACT

A phase-change memory device and a fabrication method thereof, capable of reducing driving current while minimizing a size of a contact hole used for forming a PN diode in the phase-change memory device that employs the PN diode. The method of fabricating the phase-change memory device includes the steps of preparing a semiconductor substrate having a junction area formed with a dielectric layer, forming an interlayer dielectric layer having etching selectivity lower than that of the dielectric layer over an entire structure, and forming a contact hole by removing predetermined portions of the interlayer dielectric layer and the dielectric layer. The contact area between the PN diode and the semiconductor substrate is increased so that interfacial resistance is reduced.

14 Claims, 3 Drawing Sheets

PHASE-CHANGE MEMORY DEVICE AND METHOD FOR MANUFACTURING THE SAME

CROSS-REFERENCES TO RELATED APPLICATION

This application claims the benefit under 35 U.S.C. 119(a) of Korean Patent Application No. 10-2007-0080510, filed on Aug. 10, 2007, in the Korean Intellectual Property Office, the disclosure of which is incorporated herein in its entirety by reference as if set forth in full.

BACKGROUND

1. Technical Field

The embodiments described herein relate to a phase-change memory device, and more particularly to a phase-change memory device capable of reducing driving current while minimizing a size of a contact hole used for forming a PN diode in the phase-change memory device that employs the PN diode.

2. Related Art

It will be understood that Dynamic Random Access Memory (DRAM), Static Random Access Memory (SRAM), and a flash memory are extensively used in a variety of devices. It will also be understood that a DRAM can be fabricated at a relatively low cost and represents a random access function, but it is a volatile memory. A SRAM used for a cache memory represents a random access function and a higher operational speed, but it is also a volatile memory and has a large size, resulting in high fabrication cost. A flash memory, on the other hand, is a nonvolatile memory and has advantages in terms of the fabrication cost and power consumption, but provides a lower operational speed.

A Phase-change Random Access Memory (PRAM) has been suggested to overcome the problems occurring in the above memory devices.

A PRAM is a memory device which records and reads out information by using a phase-change material that provides high resistance in an amorphous state and low resistance in a crystalline state. A conventional PRAM generally provides higher operational speed and a higher degree of integration as compared with a flash memory. Recently, in order to improve the degree of integration for PRAM, a cell in a conventional PRAM device can be formed using a diode structure.

FIG. 1 is a schematic sectional view showing a conventional PRAM device that uses such a cell. As shown in FIG. 1, an isolation layer 12 is formed on a semiconductor substrate 10 to define a core region and a cell region. Ions are implanted into the cell region, thereby forming a line type junction area 14.

Then, a gate stack 16 is formed in the core region and an interlayer dielectric layer 24 is formed on the entire structure including the core region and the cell region. Then, a predetermined portion of the interlayer dielectric layer 24 formed in the cell region is removed to form a contact hole 26 for forming a PN diode.

The gate stack 16 is prepared as a polycide structure. For instance, the gate stack 16 may consist of a hard mask nitride layer (HM Nit), metal silicide (for example, WSix) and a polysilicon layer. In addition, spacers 18 are formed at both sidewalls of the gate stack 16. Further, an oxide layer 20 and a nitride layer 22 are sequentially formed on the entire structure as a diffusion barrier. In general, the interlayer dielectric layer 24 is an oxide layer.

After forming the contact hole 26, a PN diode (not shown) is formed in the contact hole 26 through a selective epitaxial growth process.

In the above PRAM manufacturing process, the contact hole 26 must have a micro size to realize high integration of a device. However, there is a problem in that the bottom critical dimension D2 of the interlayer dielectric layer 24 has become smaller than the top critical dimension D1 of the interlayer dielectric layer 24 after the contact hole 26 has been formed through the mask and etching processes. That is, the interlayer dielectric layer 24 formed in the junction area 14 has a relatively large thickness of a few thousand Å, and an amount of etching gas has become reduced as it reaches the bottom of the interlayer dielectric layer 24. In addition, the oxide layer used as the interlayer dielectric layer 24 has etching selectivity similar to that of the oxide layer 20 formed on the junction area 14, so that the etching rate may be lowered at the bottom of the contact hole. As a result, the bottom critical dimension of a etching target layer is reduced by 80% as compared with the top critical dimension thereof.

For this reason, a contact area between the PN diode and the semiconductor substrate 10 may be reduced, causing the resistance to increase. As a result, the operational current is reduced, requiring a large driving current. In addition, as conventional semiconductor devices have become more highly integrated, the gap between PN diodes is reduced and resistance is increased at the bottom of the PN diode. In this case, a conventional semiconductor device may be subject to malfunction due to interference between adjacent diodes.

SUMMARY

A phase-change memory device and method for manufacturing the same, capable of enlarging the bottom critical dimension of a contact hole by causing a notch phenomenon at the bottom of the contact hole that is used for forming a PN diode is described herein as is a phase-change memory device and method for manufacturing the same, capable of reducing driving current for the phase-change memory device by enlarging a contact area between a PN diode and a semiconductor substrate.

According to one aspect, a method of fabricating a phase-change memory device that includes a PN diode comprising providing a semiconductor substrate having a junction area formed with a dielectric layer, forming an interlayer dielectric layer over the dielectric layer, the interlayer dielectric layer having etching selectivity lower than that of the dielectric layer, and forming a contact hole by etching predetermined portions of the interlayer dielectric layer and the dielectric layer.

According to another aspect, a phase-change memory device comprises a semiconductor substrate having a junction area, a PN diode formed in the junction area, and a bottom electrode contact that makes contact with the PN diode, wherein a bottom critical dimension of the PN diode is equal to or larger than a top critical dimension of the PN diode.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

As described below, the embodiments described herein can reduce interfacial resistance while minimizing the size of the contact hole used for forming the PN diode in the phase-change memory device by enlarging the contact area between the PN diode and the semiconductor substrate. Therefore, operational current for the phase-change memory device can be maximized even if relatively low driving current is applied thereto, so that the phase-change memory device can be stably operated while realizing high integration.

FIGS. 2A to 2D are sectional views illustrating a process for forming a phase-change memory device according to one embodiment in which cell regions defined by an isolation layer are illustrated.

Figure 1:
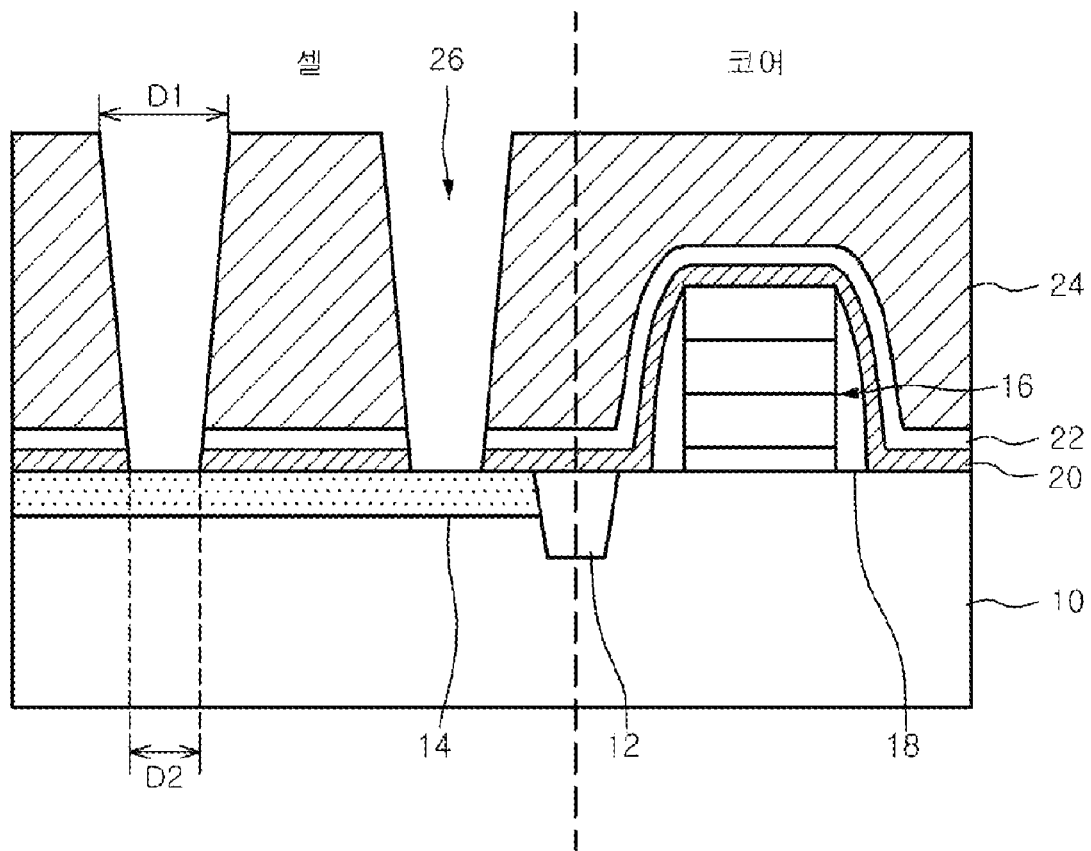
FIG. 1 is a schematic sectional view showing a conventional phase-change memory device.
Figure 2A:
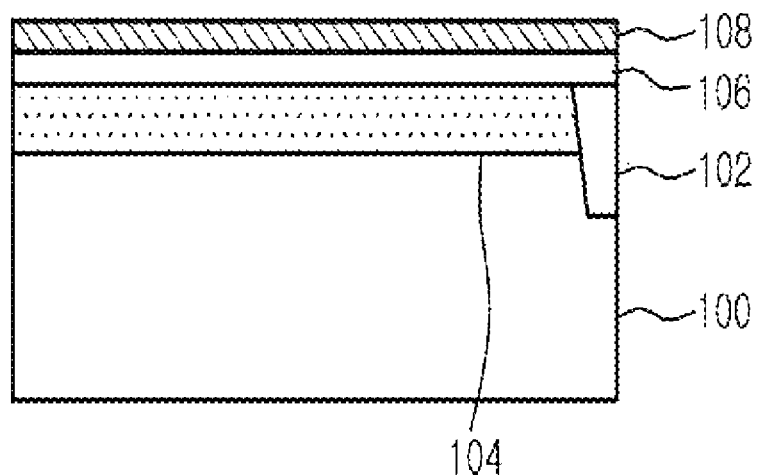
FIGS. 2A to 2D are sectional views illustrating a process for forming a phase-change memory device according to one embodiment.

As shown in FIG. 2A, an isolation layer 102 can be formed on a semiconductor substrate 100 and ions can then be implanted onto a cell region within the substrate 100, thereby forming a junction area 104. First and second dielectric layers 106 and 108 can then be sequentially formed on the entire structure.

The first dielectric layer 106 can be a gate oxide layer that is formed when a gate stack is formed on a core region, or it can be a thermal oxide layer that serves as a diffusion barrier. In addition, the second dielectric layer 108 can be a nitride layer that serves as a diffusion barrier. Depending on the requirements of a specific implementation, the second dielectric layer 108 can be omitted.

Figure 2B:
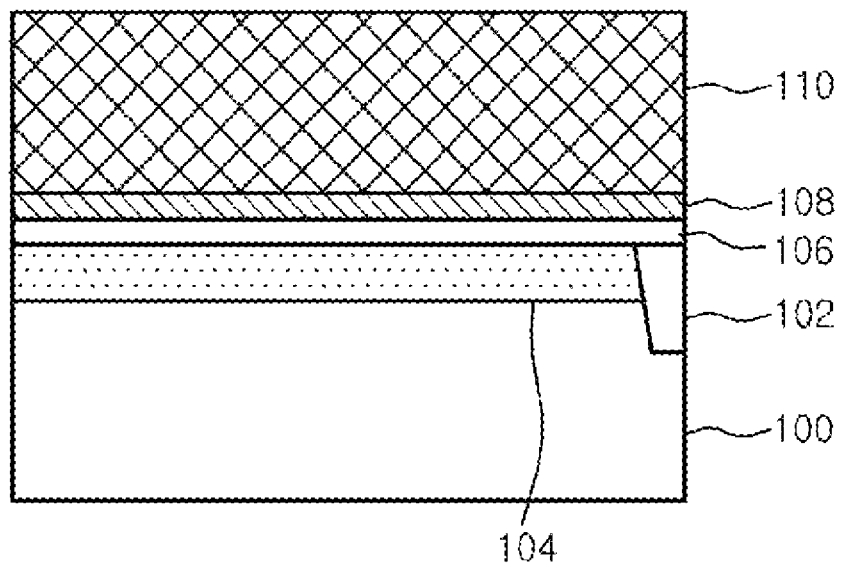

Referring to FIG. 2B, an interlayer dielectric layer 110 can then be formed on the entire structure. The interlayer dielectric layer 110 can include a material having etching selectivity lower than that of the first dielectric layer 106. Preferably, the interlayer dielectric layer 110 can include a nitride layer. The interlayer dielectric layer 110 can be formed through chemical vapor deposition or physical vapor deposition such that the interlayer dielectric layer 110 has a thickness of about 4000 to 8000 Å.

Figure 2C:
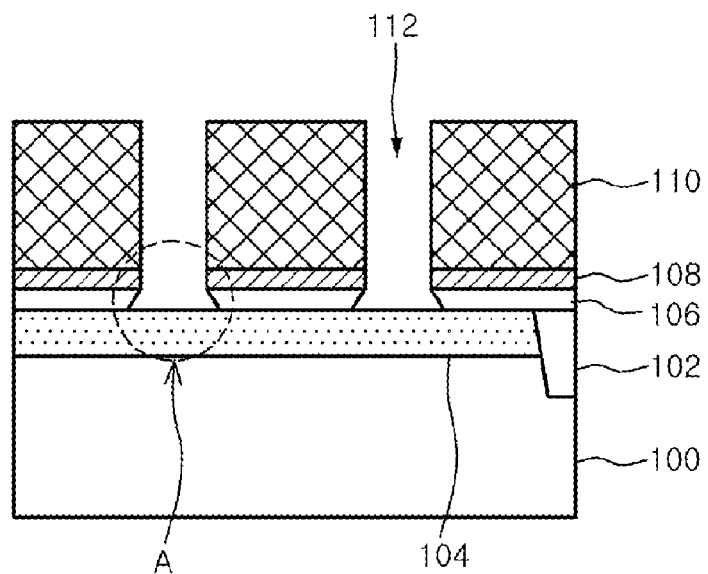

In addition, as shown in FIG. 2C, mask and etching processes can be preformed to form a contact hole 112 such that a PN diode area of the junction area 104 can be exposed. At this time, since the etching selectivity of the interlayer dielectric layer 110 is lower than that of the first dielectric layer 106, a notch A is created at the bottom of the contact hole 112.

When the mask and etching processes are performed to form the contact hole 112, the amount of loss at the bottom of the contact hole 112 caused by overetching must be controlled to be less than 30 Å, preferably, about 1 to 30 Å. In addition, after the mask and etching processes have been finished, the bottom critical dimension of the contact hole must be set in the range of about 90 to 120%, preferably about 100 to 120% relative to the top critical dimension of the contact hole. For instance, if the top critical dimension of the contact hole is 110 nm, the bottom critical dimension of the contact hole can be set in the range of 100 to 130 nm.

Meanwhile, a cleaning process can be performed after the mask and etching processes. The cleaning process can be performed for about 10 seconds to 10 minutes by using solutions representing superior etching selectivity relative to the oxide layer, such as a first cleaning solution (B), a second cleaning solution (O), a third cleaning solution (N), or a mixture (BN or BON) thereof. In addition, the cleaning process can be performed for about 10 seconds to 10 minutes by using a cleaning solution, which is prepared by mixing hydrogen fluoride (HF) with pure water. Further, the cleaning process can be performed for about 10 to 50 seconds through LET (light etch treatment).

The first cleaning solution can contain sulfuric acid ($H_2SO_4$) and hydrogen peroxide ($H_2O_2$), e.g., in the ratio of 4:1, the second cleaning solution can include a BOE (buffered oxide etchant) solution that, e.g., contains ammonium fluoride ($NH_4F$) and hydrogen fluoride (HF) mixed in the ratio of 20:1 to 300:1, and the third cleaning solution can, e.g., contain ammonium hydroxide ($NH_4OH$), hydrogen peroxide ($H_2O_2$) and pure water in the ratio of 1:4:20.

Meanwhile, in the cleaning solution prepared by mixing hydrogen fluoride (HF) with pure water, the ratio of pure water to HF can be 40:1 to 200:1.

Figure 2D:
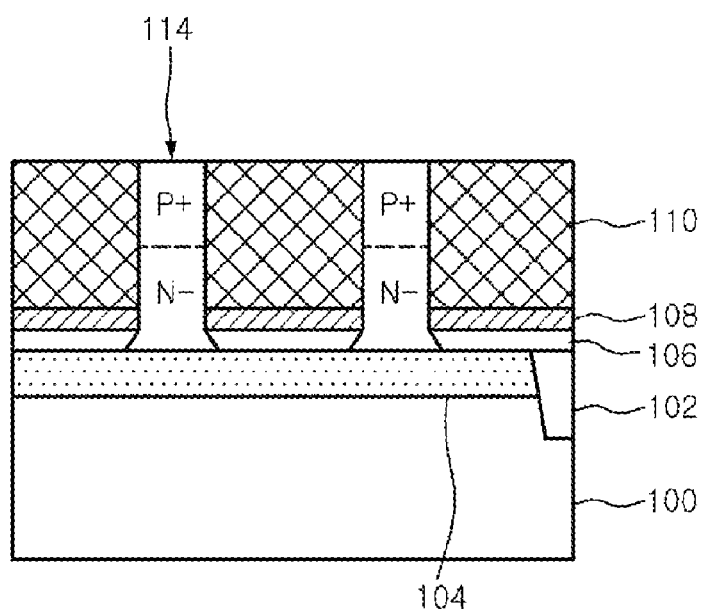

Then, as shown in FIG. 2D, a PN diode 114 can be formed in the contact hole 112 through a selective epitaxial growth process. As can be understood from FIG. 2D, a contact area between the bottom of the PN diode 114 and the junction area 104 is increased, so that resistance is decreased and operational current is increased.

Further, although not shown in the drawings, a Bottom Electrode Contact (BEC) can be formed after forming the PN diode 114. In addition, a phase-change material layer, a top electrode, word lines and bit lines can be subsequently formed, thereby forming a phase-change memory device.

A phase-change memory device fabricated through the above procedure can include a semiconductor substrate having a junction area, a PN diode formed in the junction area, and a bottom electrode contact that makes contact with the PN diode. In addition, the bottom critical dimension of the PN diode can be equal to or larger than the top critical dimension. In addition, such a phase-change memory device can further include dielectric layers formed at both sidewalls of the PN diode and the interlayer dielectric layer having etching selectivity lower than that of the dielectric layer.

In certain embodiments, dielectric material formed on the top of the junction area can have an etching selectivity different from that of material used for the interlayer dielectric layer, so that a notch is formed at the bottom of the contact hole, which is used for forming the PN diode, after the etching and cleaning processes. Thus, the contact area between the PN diode and the semiconductor substrate can be increased and the operational current of the semiconductor device can be maximized.

Further, in certain embodiments, the size of the contact hole for forming the PN diode can be minimized and the contact area between the PN diode and the semiconductor substrate can be increased, so that the operational current is increased even if relatively low driving current is applied to the semiconductor device.

Therefore, in accordance with the embodiments described herein, a phase-change memory device can operate with low current consumption and without increasing the size of the phase-change memory device. Thus, such a phase-change memory device is preferably applicable for portable equipment, such as a mobile phone, a PDA, a mobile PC, etc.

It will be apparent to those skilled in the art that various modifications and changes may be made without departing from the scope and spirit of the embodiments described herein. Therefore, it should be understood that the above embodiments are not limitative, but illustrative in all aspects. The scope of the above embodiments are defined by the appended claims rather than by the description preceding them, and therefore all changes and modifications that fall within metes and bounds of the claims, or equivalents of such metes and bounds are therefore intended to be embraced by the claims.

What is claimed is:

1. A method of fabricating a phase-change memory device that includes a PN diode, comprising:
    providing a semiconductor substrate having a junction area formed with a dielectric layer;
    forming an interlayer dielectric layer over the dielectric layer, the interlayer dielectric layer having etching selectivity lower than that of the dielectric layer; and
    forming a contact hole by etching predetermined portions of the interlayer dielectric layer and the dielectric layer, wherein the hole and a notch define a top critical dimension and a bottom critical dimension of the contact hole, and wherein the bottom critical dimension is in a range of 101 to 120% relative to a top critical dimension.

2. The method of claim 1, wherein the dielectric layer includes an oxide layer and the interlayer dielectric layer includes a nitride layer.

3. The method of claim 1, wherein the interlayer dielectric layer has a thickness of 4000 to 8000 Å.

4. The method of claim 1, wherein the etching causes the notch to be formed in the dielectric layer at the bottom of the contact hole, the notch being defined by an amount of loss, an wherein the amount of loss is in a range of 1 to 30 Å.

5. The method of claim 1, wherein a cleaning process is performed after forming the contact hole.

6. The method of claim 5, wherein the cleaning process is performed by using a cleaning solution that contains sulfuric acid ($H_2SO_4$) and hydrogen peroxide ($H_2O_2$) in a ratio of 4:1.

7. The method of claim 5, wherein the cleaning process is performed by using a cleaning solution including a BOE (buffered oxide etchant) solution that contains ammonium fluoride ($NH_4F$) and hydrogen fluoride (HF) mixed in a ratio of 20:1 to 300:1.

8. The method of claim 5, wherein the cleaning process is performed by using a cleaning solution that contains ammonium hydroxide ($NH_4OH$), hydrogen peroxide ($H_2O_2$) and pure water in a ratio of 1:4:20.

9. The method of claim 5, wherein the cleaning process is performed by using a cleaning solution that contains pure water and hydrogen fluoride (HF) in a ratio of 40:1 to 200:1.

10. The method of claim 5, wherein the cleaning process is performed for 10 to 50 seconds through LET (light etch treatment).

11. A phase-change memory device comprising:
    a semiconductor substrate having a junction area;
    a PN diode formed in the junction area; and
    a bottom electrode contact that makes contact with the PN diode, wherein a bottom critical dimension of the PN diode is larger than a top critical dimension of the PN diode.

12. The phase-change memory device of claim 11, wherein the bottom critical dimension of the PN diode is in a range of 101 to 120% relative to the top critical dimension of the PN diode.

13. The phase-change memory device of claim 11, further comprising dielectric layers sequentially formed at both sidewalls of the PN diode and an interlayer dielectric layer having etching selectivity lower than that of the dielectric layers.

14. The phase-change memory device of claim 13, wherein the dielectric layers include oxide layers and the interlayer dielectric layer includes a nitride layer.

* * * * *